(12) United States Patent
Anzai (10) Patent No.: US 7,616,167 B2
(45) Date of Patent: Nov. 10, 2009

(54) SEMICONDUCTOR DEVICE AND METHOD OF PRODUCING THE SAME

(75) Inventor: Noritaka Anzai, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 178 days.

(21) Appl. No.: 11/606,224

(22) Filed: Nov. 30, 2006

(65) Prior Publication Data

US 2007/0236393 A1  Oct. 11, 2007

(30) Foreign Application Priority Data

Apr. 7, 2006  (JP) ............... 2006-105978

(51) Int. Cl.
  *H01L 21/00* (2006.01)
  *G06K 19/06* (2006.01)
(52) U.S. Cl. ..................... 343/787; 257/621
(58) Field of Classification Search ........... 343/787; 257/621
  See application file for complete search history.

(56) References Cited

U.S. PATENT DOCUMENTS 6,249,242 B1 *  6/2001  Sekine et al. ............... 342/70
6,933,613 B2 *  8/2005  Akashi ...................... 257/778
7,295,168 B2 * 11/2007  Saegusa et al. ............. 343/788

FOREIGN PATENT DOCUMENTS

| JP | 5-48328 | 2/1993 |
| JP | 5-67919 | 3/1993 |
| JP | 2003-243570 | 8/2003 |

* cited by examiner

*Primary Examiner*—Sue Purvis
*Assistant Examiner*—Krista Soderholm
(74) *Attorney, Agent, or Firm*—Kubotera & Associates, LLC (57) ABSTRACT

A semiconductor device includes a semiconductor substrate having a first surface and a second surface opposite to the first surface; a first through wiring penetrating through the semiconductor substrate from the first surface to the second surface; an antenna formed on the first surface and electrically connected to the first through wiring; a semiconductor element formed on the second surface and electrically connected to the first through wiring; a first sealing layer formed on the second surface to cover the semiconductor element; and a first external terminal having one end portion exposed from the first sealing layer and the other end portion electrically connected to the semiconductor element.

10 Claims, 7 Drawing Sheets

SEMICONDUCTOR DEVICE AND METHOD OF PRODUCING THE SAME

BACKGROUND OF THE INVENTION AND RELATED ART STATEMENT

The present invention relates to a semiconductor device having a packaged structure, and a method of producing the semiconductor. In particular, the present invention relates to a semiconductor device of a resin sealing type produced with Wafer-level Chip Size Package (WCSP) technology. In the semiconductor device, an antenna is formed on a surface of a semiconductor substrate opposite to a surface with an element formed thereon.

Patent References 1 and 2 have disclosed conventional semiconductor devices, in which an inductor used as an antenna and a semiconductor element are formed on a same substrate. Such a semiconductor device includes a wireless Integrated Circuit (IC) tag having an antenna for reception and transmission.

In the conventional semiconductor device, in which the inductor used as the antenna and the semiconductor element are formed on the same substrate, it is not necessary to provide a substrate for disposing the antenna, thereby making it possible to reduce a size of the semiconductor device. In a semiconductor device, in general, a semiconductor element is formed on one surface of a semiconductor substrate (element forming surface), and an antenna is formed on an interlayer insulation layer or a passivasion layer formed to cover the semiconductor element. That is, the semiconductor element and the antenna are formed on the same surface.

Patent reference 3 has disclosed a configuration, in which a conductive layer connected to earth is disposed between an antenna and a semiconductor element.

Patent Reference 1: Japanese Patent Publication No. 2003-243570

Patent Reference 2: Japanese Patent Publication No. 05-48328

Patent Reference 3: Japanese Patent Publication No. 05-67919

In the conventional semiconductor device described above, the antenna is formed on the element forming surface of the semiconductor substrate. In this case, when a signal is received or transmitted, the semiconductor element receives influence from radio wave emitted from the antenna. Accordingly, characteristic of the semiconductor element may be deteriorated, or the semiconductor device may malfunction.

In order to solve such a problem, the antenna may be formed on a surface of the semiconductor substrate opposite to the element forming surface (refer to Patent References 1 and 2).

According to the technology disclosed in Patent Reference 1, bumps are formed on the element forming surface and the opposite surface for electrically and mechanically connecting the semiconductor device to a mounting substrate. Accordingly, the antenna and the bump are formed on the same surface of the semiconductor substrate. In such a configuration, when the semiconductor device is mounted on the mounting substrate, the antenna is sandwiched between the semiconductor substrate and the mounting substrate. Accordingly, reception sensitivity of the semiconductor device may lower, or intensity of transmitted radio wave may decrease.

According to the technology disclosed in Patent Reference 2, the antenna is formed on a surface of the semiconductor substrate opposite to the element forming surface. However, Patent Reference 2 does not specify which direction the surface with the antenna formed thereon is arranged relative to the mounting substrate when the semiconductor device is mounted on the mounting substrate. Accordingly, it is difficult to solve the problems described above.

In view of the problems described above, an object of the present invention is to provide a semiconductor device capable of reducing influence received by a semiconductor element when an antenna emits radio wave. Another object of the present invention is to provide a method of producing the semiconductor device.

Further objects and advantages of the invention will be apparent from the following description of the invention.

SUMMARY OF THE INVENTION

In order to attain the objects described above, according to a first aspect of to the present invention, a semiconductor device includes a semiconductor substrate having a first surface and a second surface opposite to the first surface; a first through wiring penetrating through the semiconductor substrate from the first surface to the second surface; an antenna formed on the first surface and electrically connected to the first through wiring; a semiconductor element formed on the second surface and electrically connected to the first through wiring; a first sealing layer formed on the second surface to cover the semiconductor element; and a first external terminal having one end portion exposed from the first sealing layer and the other end portion electrically connected to the semiconductor element.

In the first aspect of the present invention, the antenna is formed on the first surface opposite to the second surface with the semiconductor element formed thereon. Accordingly, it is possible to provide a large distance between the antenna and the semiconductor element. As a result, it is possible to reduce influence received by the semiconductor element when the antenna emits radio wave.

Further, in the first aspect of the present invention, the first external terminal is formed on the second surface opposite to the first surface with the antenna formed thereon. Accordingly, it is possible to prevent reception sensitivity of the semiconductor device from lowering, or intensity of transmitted radio wave from decreasing.

According to a second aspect of to the present invention, a method of producing a semiconductor device includes the steps of: preparing a semiconductor substrate having a first surface and a second surface opposite to the first surface; forming a through hole penetrating through the semiconductor substrate from the first surface to the second surface; filling the through hole with a conductive material to form a through wiring penetrating through the semiconductor substrate; forming a semiconductor element and a wiring each electrically connected to the through wiring on the second surface; forming an antenna electrically connected to the through wiring on the first surface; forming a first external terminal electrically connected to the semiconductor element on the second surface; and forming a first sealing layer on the second surface to cover the semiconductor element and the wiring such that a part of the first external terminal is exposed.

In the second aspect of the present invention, the antenna is formed on the first surface opposite to the second surface with the semiconductor element formed thereon. Accordingly, it is possible to provide a large distance between the antenna and the semiconductor element. As a result, it is possible to produce the semiconductor device capable of reducing influence received by the semiconductor element when the antenna emits radio wave.

Further, in the second aspect of the present invention, the first external terminal is formed on the second surface opposite to the first surface with the antenna formed thereon. Accordingly, when the semiconductor device is mounted on a mounting substrate, the antenna is not sandwiched between the semiconductor substrate and the mounting substrate. As a result, it is possible to produce the semiconductor device capable of preventing reception sensitivity of the semiconductor device from lowering, or intensity of transmitted radio wave from decreasing.

According a third aspect of to the present invention, a method of producing a semiconductor device includes the steps of: preparing a semiconductor substrate having a first surface and a second surface opposite to the first surface; forming a first through hole and a second through hole each penetrating through the semiconductor substrate from the first surface to the second surface; filling the first through hole and the second through hole with a conductive material to form a first through wiring and a second through wiring each penetrating through the semiconductor substrate; forming a semiconductor element and a wiring each electrically connected to the first through wiring on the second surface; forming a first insulation layer on the first surface; forming a first opening portion in the first insulation layer to expose the second through wiring; forming a conductive layer electrically connected to the second through hole on the first insulation layer in the first opening portion; forming a second insulation layer on the first insulation layer and the conductive layer; forming a second opening in the first insulation layer and the second insulation layer to expose the first through wiring; forming an antenna electrically connected to the first through wiring on the second insulation layer and inside the second opening; forming a first external terminal electrically connected to the semiconductor element on the second surface; and forming a first sealing layer on the second surface to cover the semiconductor element and the wiring such that a part of the first external terminal is exposed.

In the third aspect of the present invention, the antenna is formed on the first surface opposite to the second surface with the semiconductor element formed thereon. Accordingly, it is possible to provide a large distance between the antenna and the semiconductor element. As a result, it is possible to produce the semiconductor device capable of reducing influence received by the semiconductor element when the antenna emits radio wave.

Further, in the third aspect of the present invention, the first external terminal is formed on the second surface opposite to the first surface with the antenna formed thereon. Accordingly, when the semiconductor device is mounted on a mounting substrate, the antenna is not sandwiched between the semiconductor substrate and the mounting substrate. As a result, it is possible to produce the semiconductor device capable of preventing reception sensitivity of the semiconductor device from lowering, or intensity of transmitted radio wave from decreasing.

Further, in the third aspect of the present invention, the conductive layer is formed between the semiconductor substrate and the antenna for functioning as shield. Accordingly, it is possible to further reduce the influence received by the semiconductor element when the antenna emits radio wave.

As described above, in the aspects of the present invention, it is possible to provide the semiconductor device and the method of producing the same, in which it is possible to reduce the influence received by the semiconductor element when the antenna emits radio wave.

DETAILED DESCRIPTION OF PREFERRED EMBODIMENTS

Hereunder, embodiments of the present invention will be explained with reference to the accompanying drawings. In the following description of the present invention, each of the drawings is illustrated schematically in terms of a size and a dimensional relationship for explaining the embodiments of the present invention, and the present invention is not limited to a shape, a size, and a dimensional relationship shown in the drawings. In the drawings, a part of hatching is omitted for explaining a configuration clearly. In the following description, a numerical limitation is just an example, and the present invention is not limited thereto.

First Embodiment

Figure 1:
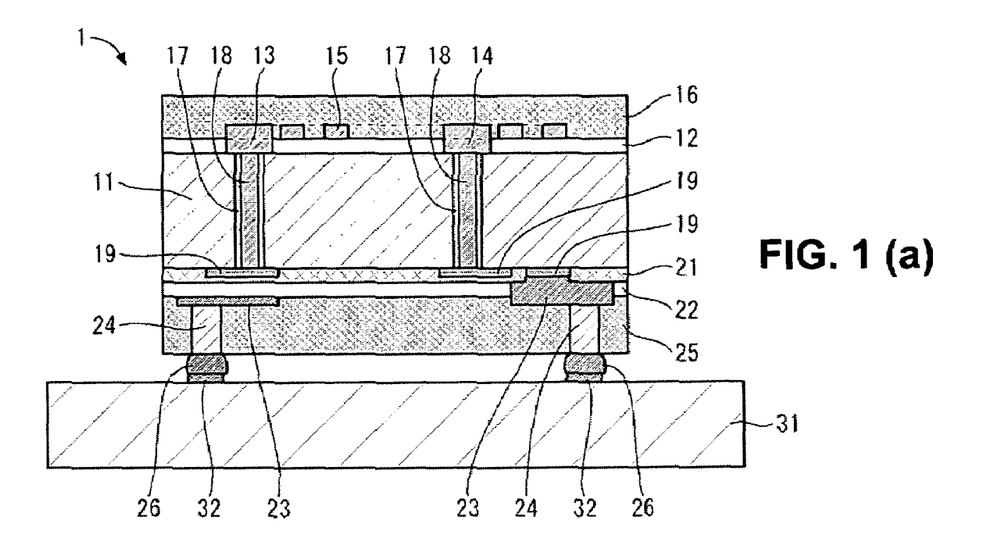
FIG. 1(a) is a schematic sectional view showing a semiconductor device according to a first embodiment of the present invention.
FIG. 1(b) is a schematic plan view showing an antenna according to the first to fifth embodiments of the present invention.
Figure 2:
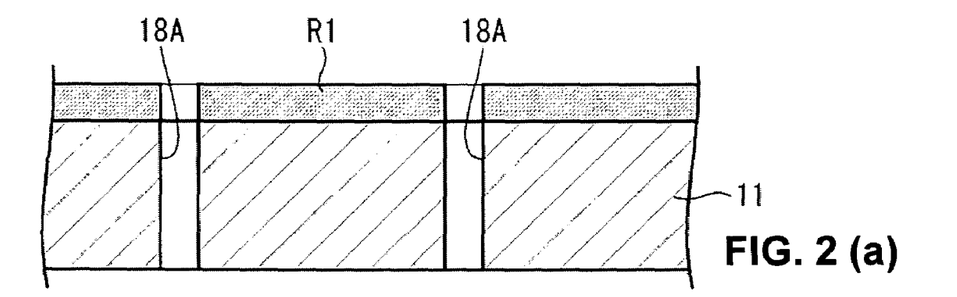
FIGS. 2(a) to 2(d) are schematic views showing a method of producing the semiconductor device according to the first embodiment of the present invention.
Figure 3:
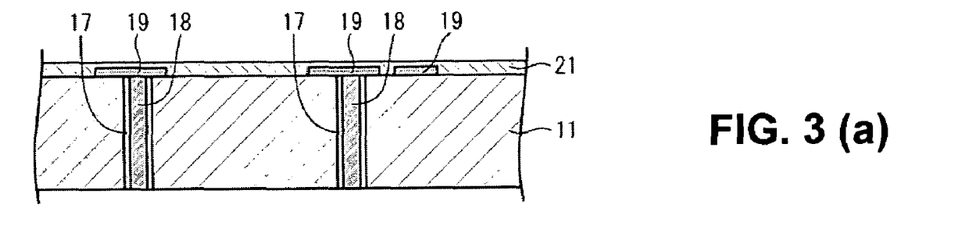
FIGS. 3(a) to 3(d) are schematic views showing a method of producing the semiconductor device according to the first embodiment of the present invention.

A first embodiment of the present invention will be explained with reference to the accompanying drawings. FIG. 1(a) is a schematic sectional view showing a semiconductor device 1 according to a first embodiment of the present invention. In FIG. 1(a), a section is taken along a plane perpendicular to an element forming surface of a semiconductor substrate 11. FIG. 1(b) is a schematic plan view showing an example of an antenna 15 of the semiconductor device 1.

As shown in FIG. 1(a), the semiconductor device 1 includes the semiconductor substrate 11; an insulation layer 12; an electrode pad 13; an electrode pad 14; the antenna 15, via inner insulation layers 17; through wirings 18; electrode pads 19; an element forming layer 21; an insulation layer 22; electrode pads 23; external terminals 24; and a sealing layer 25. The semiconductor device 1 is electrically connected to a mounting substrate 31 having external terminals 32 through bumps 26.

In the embodiment, the semiconductor substrate 11 is formed of a silicon substrate, and may be formed of various substrates. Further, the semiconductor substrate 11 has a thickness of about 100 to 300 μm.

The through wirings 18 are formed in through holes penetrating the semiconductor substrate 11 from one main surface (first surface) to the other main surface (second surface). Each of the through wirings 18 has one end portion electrically connected to the electrode pad 13 or the electrode pad 14 and the other end portion electrically connected to the electrode pads 19. Accordingly, the first surface side and the second surface side are electrically connected with the through wirings 18.

Through holes are formed to pass through the semiconductor substrate 11, and are filled with a conductive material such as copper and aluminum to form the through wirings 18. The through wirings 18 have a diameter of about 10 μm. The diameter is not limited to 10 μm, and is preferred to be small as possible.

The via inner insulation layers 17 are provided for preventing the through wirings 18 formed in the semiconductor substrate 11 from being electrically connected to the semiconductor substrate 11. After the through holes are formed in the semiconductor substrate 11 for forming the through wirings 18, surfaces of the through holes are oxidized to form the via inner insulation layers 17. The via inner insulation layers 17 have a thickness of, for example, about 0.10 μm.

The insulation layer 12 is provided for insulating the main surface (first surface) of the semiconductor substrate 11 where the antenna 15 is formed. The insulation layer 12 may be formed of a polyimide, and have a thickness of, for example, about 5 to 10 μM.

The antenna 15 is formed on the insulation layer 12 formed on the first surface of the semiconductor substrate 11. As shown in FIG. 1(b), the antenna 15 may be formed of a coiled wiring having an inductor shape. The antenna 15 may be formed of copper or aluminum, and have a thickness of, for example, about 1 μm. The antenna 15 may include a whip (rod) antenna; a dipole antenna; a Yagi-Uda antenna; a loop antenna; a dielectric antenna; and the likes.

The electrode pads 13 and 14 are provided for electrically connecting the antenna 15 and the through wirings 18. The electrode pads 13 and 14 are disposed in openings formed in the insulation layer 12 on the first surface such that the one end portions of the through wirings 18 are exposed, and are also arranged to protrude from the openings. Accordingly, the electrode pad 13 and the electrode pad 14 are connected to the one end portions of the through wirings 18 penetrating through the semiconductor substrate 11. Similar to the antenna 15, the electrode pad 13 and the electrode pad 14 may be formed of copper or aluminum, and may be integrated with the antenna 15 to form an integrated conductive layer.

The sealing layer 16 is provided for protecting the electrode pad 13, the electrode pad 14, and the antenna 15 formed on the insulation layer 12, and also for preventing the electrode pad 13, the electrode pad 14, and the antenna 15 from electrically contacting with an external object. The sealing layer 16 may be formed of a thermosetting resin with insulation property such as an epoxy resin, and may be formed of an insulation material generally used for sealing a semiconductor element. The sealing layer 16 has a thickness large enough for covering the antenna 15, the electrode pad 13, and the electrode pad 14, for example, about 10 μm.

A semiconductor element such as a transistor and a capacitor is formed in the insulation layer 12. Other than the semiconductor element such as a transistor and capacitor, the element forming layer 21 includes an interlayer layer (intermediate insulation layer) and a passivasion layer formed at an uppermost layer. The element forming layer 21 is formed on the second surface opposite to the first surface with the antenna 15 formed thereon.

The electrode pads 19 are formed on the second surface of the semiconductor substrate 11. Some of the electrode pads 19 are electrically connected to the other end portions of the through wirings 18 on the second surface. Accordingly, the antenna 15 formed on the first surface of the semiconductor substrate 11 is electrically drawn to the second surface of the semiconductor substrate 11 through the electrode pad 13, the electrode pad 14, and the through wirings 18. The electrode pads 19 may be formed of copper or aluminum, and have a thickness of, for example, about 0.5 μm. The electrode pads 19 may be formed in the element forming layer 21 or on the element forming layer 21.

The insulation layer 22 is provided for insulating the element forming layer 21. The insulation layer 22 may be formed of an insulation material such as polyimide, and has a thickness of, for example, about 5 to 10 μm.

The electrode pads 23 are formed on the insulation layer 22 or in the insulation layer 22, and have upper surfaces exposed from the insulation layer 22. The electrode pads 23 are electrically connected to the semiconductor element and the electrode pads 19 through a wiring. The electrode pads 23 may be formed of copper or aluminum, and have a thickness from an upper surface of the insulation layer 22 of, for example, about 1.0 μm. In FIG. 1(a), a part of the wiring electrically connected to the electrode pads 23 and the semiconductor element or the electrode pads 19 is omitted for clear explanation.

The external terminals 24 are provided for electrically drawing electric connection of the electrode pads 23 covered with the sealing layer 25 (described later) over the sealing layer 25. The external terminals 24 have one end portions bonded to the electrode pads 23, and the other end portions exposed from the sealing layer 25. An external terminal shaped member formed of a conductive material such as copper and aluminum may be applied to the external terminals 24.

The sealing layer 25 is provided for protecting the electrode pads 23 exposed on the insulation layer 22, and also for preventing the electrode pads 23 from electrically contacting with an external object. The sealing layer 25 may be formed of a thermosetting resin with insulation property such as an epoxy resin, and may be formed of an insulation material generally used for sealing a semiconductor element. The sealing layer 25 has a thickness large enough for covering the electrode pads 23, for example, about 10 μm.

Note that, as described above, the external terminals 24 connected to the electrode pads 23 are disposed in the sealing layer 25. Accordingly, the antenna 15 and the semiconductor element in the element forming layer 21 are electrically drawn to the surface of the sealing layer 25 through the electrode pads 23 and the external terminals 24.

The semiconductor device 1 having the configuration described above is mounted on the mounting substrate 31. At least a chip (not shown) and the external terminals 32 are formed on the mounting substrate 31. The semiconductor device 1 is mounted on the mounting substrate 31 through bumps 26 such as solder balls. That is, the external terminals 24 exposed from the sealing layer 25 are connected to the external terminals 32 on the mounting substrate 31 through the bumps 26, so that the semiconductor device 1 is fixed and electrically connected to the mounting substrate 31.

As described above, in the semiconductor device 1 according to the first embodiment of the present invention, the antenna 15 is formed on the one main surface (first surface) of the semiconductor substrate 11, and the element forming layer 21 including the semiconductor element is formed on the other main surface (second surface). Accordingly, it is possible to reduce influence received by the semiconductor element when the antenna 15 emits radio wave. Further, the semiconductor device 1 is mounted on the mounting substrate 31 in a facedown state, that is, the second surface with the element forming layer 21 formed thereon faces the mounting substrate 31. Accordingly, the antenna 15 is not sandwiched between the semiconductor substrate 11 and the mounting substrate 31. As a result, it is possible to prevent reception sensitivity of the semiconductor device 1 from lowering, or intensity of transmitted radio wave from decreasing.

A method of producing the semiconductor device 1 will be explained with reference to the accompanying drawings. FIGS. 2(a) to 2(d) are schematic views showing a method of producing the semiconductor device 1 according to the first embodiment of the present invention. FIGS. 3(a) to 3(d) are schematic views showing the method of producing the semiconductor device 1 according to the first embodiment of the present invention.

First, the semiconductor substrate 11 having a thickness of, for example, about 600 to 700 μm is prepared. A specific resist solution is spin-coated on the second surface of the semiconductor substrate 11. Then, the coated resist solution is processed with known exposure process and developing process to form a resist pattern R1 having an opening portion in an area where the through wirings 18 and the via inner insulation layers 17 are formed. The opening portion of the resist pattern R1 has a diameter equal to a sum of a diameter of the through wirings 18 and the thickness of the via inner insulation layers 17, for example, about 10.2 μm in the embodiment.

In the next step, as shown in FIG. 2(a), the semiconductor substrate 11 is dry-etched with the resist pattern R1 as a mask to form through holes 18A passing through the semiconductor substrate 11. Note that the semiconductor substrate 11 may be dry-etched with known technology, and explanation thereof is omitted.

In the next step, after the resist pattern R1 is removed, the surface of the semiconductor substrate 11 is thermally oxidized to form a silicon oxidized layer 101 on the second surface of the semiconductor substrate 11 as shown in FIG. 2(b). At the same time, the via inner insulation layers 17 having a thickness of, for example, about 0.1 μm, are formed in the through holes 18A.

In the next step, the silicon oxidized layer 101 formed on the second surface of the semiconductor substrate 11 is polished with CMP (Chemical Mechanical Polishing) method, so that the silicon oxidized layer 101 formed on the second surface is removed and the semiconductor substrate 11 is exposed. Then, metal such as copper or aluminum is deposited on the second surface of the semiconductor substrate 11 with CVD (Chemical Vapor Deposition) method or sputtering method. At the same time, as shown in FIG. 2(c), the through holes 18A are filled with the metal to form a conductive layer 18C on the second surface and the through wirings 18 in the through holes 18A.

In the next step, the conductive layer 18C formed on the second surface of the semiconductor substrate 11 is polished with CMP method, so that the conductive layer 18C formed on the second surface is removed and the semiconductor substrate 11 is exposed as shown in FIG. 2(d). As a result, the through wirings 18 having the diameter of about 10 μm are formed in the through holes 18A. Note that the via inner insulation layers 17 are formed on the surfaces inside the through holes 18A, so that the through wirings 18 are electrically isolated from the semiconductor substrate 11.

In the next step, metal such as copper or aluminum is deposited on the second surface of the semiconductor substrate 11 to form a conductive layer having a thickness of about 0.5 μm with CVD method or sputtering method. Then, the conductive layer is patterned with known photolithography technique to form the electrode pads 19 electrically connected to the through wirings 18 on the second surface.

In the next step, as shown in FIG. 3(a), the element forming layer 21 is formed on the second surface of the semiconductor substrate 11 (that may include the electrode pads 19) through a known semiconductor element forming process. The element forming layer 21 includes the semiconductor element such as a transistor and a capacitor; the interlayer layer (intermediate insulation layer) for electrically isolating the layer with the semiconductor formed therein; and the passivasion layer formed at the uppermost layer. Note that the element forming layer 21 has the multilayer structure, and the electrode pads 19 are electrically connected to the wirings in the element forming layer 21.

In the next step, an insulation material such as a polyimide is spin-coated on the element forming layer 21 up to a thickness of about 5 to 10 μm, thereby forming the insulation layer 22. Then, the insulation layer 22 (may include the element forming layer 21) is patterned with known photolithography technique to form the opening portions for exposing the electrode pads 19 under the insulation layer 22. Then, metal such as copper or aluminum is deposited on the insulation layer 22 and inside the opening portions formed in the insulation layer 22 (may include the element forming layer 21) with CVD method or sputtering method, so that the conductive layer with a thickness of about 0.5 μm from the surface of the insulation layer 22 is formed on the insulation layer 22 and inside the opening portions formed in the insulation layer 22 (may include the element forming layer 21). Then, the conductive layer is patterned with known photolithography technique to form the electrode pads 23 as shown in FIG. 3(b). At least one of the electrode pads 23 is electrically connected to at least one of the electrode pads 19.

In the next step, the semiconductor substrate 11 is turned upside down so that the first surface faces upward. An insulation material such as a polyimide is spin-coated on the first surface of the semiconductor substrate 11 up to a thickness of about 5 to 10 μm, thereby forming the insulation layer 12. Then, the insulation layer 12 is patterned with known photolithography technique to form the opening portions for exposing the through wirings 18 exposed in the first surface of the semiconductor substrate 11. Then, metal such as copper or aluminum is deposited on the insulation layer 12 and inside the opening portions formed in the insulation layer 12 with CVD method or sputtering method, so that the conductive layer with a thickness of about 0.5 μm from the surface of the insulation layer 12 is formed on the insulation layer 12 and inside the opening portions formed in the insulation layer 12. Then, the conductive layer is patterned with known photolithography technique to form the electrode pad 13 and the electrode pad 14 inside the opening portions formed in the insulation layer 12 and the antenna 15 on the insulation layer 12 as shown in FIG. 3(c).

In the next step, a thermosetting resin such as an epoxy resin is coated on the first surface and second surface of the semiconductor substrate 11. Then, the thermosetting resin is cured with heat to form the sealing layer 16 and the sealing layer 25 on the first surface and second surface, respectively. As shown in FIG. 3(d), the semiconductor substrate 11 is cut into pieces with a known dicing device. Accordingly, as shown in FIG. 1(a), it is possible to produce the semiconductor device 1 having the terminals (upper surfaces of the external terminals 24) to be bonded to the mounting substrate 31 on the element forming surface (second surface) and the antenna 15 on the opposite surface (first surface) opposite to the element forming surface (second surface).

As described above, according to the first embodiment of the present invention, the semiconductor device 1 includes the semiconductor substrate 11 having the first surface and the second surface opposite to the first surface; the through wirings 18 penetrating through the semiconductor substrate 11 from the first surface to the second surface; the antenna 15 formed on the first surface and electrically connected to the through wirings 18; the element forming layer 21 formed on the second surface and electrically connected to the through wirings 18; the sealing layer 25 formed on the second surface of the semiconductor substrate 11 to cover the element forming layer 21 including the semiconductor element; and the external terminals 24 having one end portions exposed from the sealing layer 25 and the other end portions electrically connected to the semiconductor element in the element forming layer 21.

Further, according to the first embodiment of the present invention, the method of producing the semiconductor device 1 includes the steps of: preparing the semiconductor substrate 11 having the first surface and the second surface opposite to the first surface; forming the through holes 18A penetrating through the semiconductor substrate 11 from the first surface to the second surface; filling the through holes 18A with the conductive material to form the through wirings 18 penetrating through the semiconductor substrate 11; forming the element forming layer 21 including the semiconductor element and the wiring each electrically connected to the through wirings 18 on the second surface; forming the antenna 15 electrically connected to the through wirings 18 on the first surface; forming the external terminals 24 electrically connected to the semiconductor element in the element forming layer 21 on the second surface; and forming the sealing layer 25 on the second surface to cover the element forming layer 21 including the semiconductor element and the wiring such that the portions of the external terminals 24 are exposed.

According to the first embodiment of the present invention, the antenna 15 is formed on the surface (first surface) of the semiconductor substrate 11 opposite to the surface (second surface) with the semiconductor element formed thereon. Accordingly, it is possible to provide a large distance between the antenna 15 and the semiconductor element. As a result, it is possible to reduce influence received by the semiconductor element when the antenna 15 emits radio wave.

Further, the external terminals 24 are formed on the second surface of the semiconductor substrate 11 opposite to the first surface with the antenna 15 formed thereon. Accordingly, when the semiconductor device 1 is mounted on the mounting substrate 31, the antenna 15 is not sandwiched between the semiconductor substrate 11 and the mounting substrate 31. As a result, it is possible to prevent reception sensitivity of the semiconductor device 1 from lowering, or intensity of transmitted radio wave from decreasing.

Second Embodiment

A second embodiment of the present invention will be explained with reference to the accompanying drawings. Components in the second embodiment similar to those in the first embodiment are designated with the same reference numerals, and explanations thereof are omitted. Components in the second embodiment without specific descriptions are same as those in the first embodiment.

Figure 4:
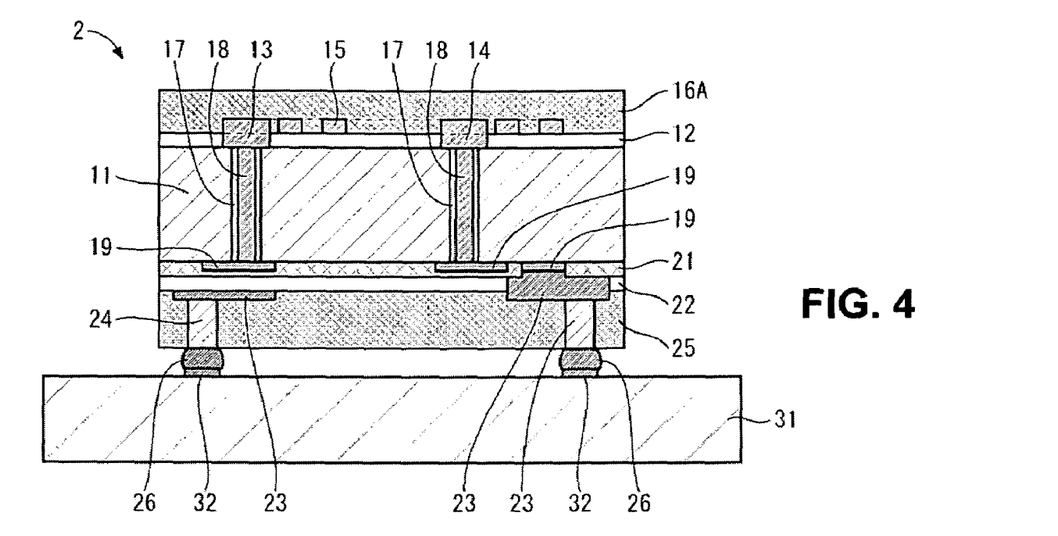
FIG. 4 is a schematic sectional view showing a semiconductor device according to a second embodiment of the present invention.

FIG. 4 is a schematic sectional view showing a semiconductor device 2 according to the second embodiment of the present invention. In FIG. 4, similar to FIG. 1(a), a section is taken along a plane perpendicular to the element forming surface of the semiconductor substrate 11.

As shown in FIG. 4, as opposed to the semiconductor device 1 in the first embodiment shown in FIG. 1(a), the semiconductor device 2 in the second embodiment includes a sealing layer 16A instead of the sealing layer 16 formed on the antenna 15 in the first embodiment.

The sealing layer 16A is formed of a magnetic material, and has a thickness large enough for covering the antenna 15, the electrode pad 13, and the electrode pad 14, for example, about 10 μm. The magnetic material includes an epoxy resin containing ferrite particles. The present invention is not limited thereto, and the magnetic material may include various thermosetting resins having thermosetting property and a resin state and containing various magnetic materials and magnetic members.

Other components and the production method are the same as those in the first embodiment, and explanations thereof are omitted. In the production method, the sealing layer 16A formed on the antenna 15 is formed of the magnetic material described above.

As described above, according to the second embodiment of the present invention, the semiconductor device 2 includes the semiconductor substrate 11 having the first surface and the second surface opposite to the first surface; the through wirings 18 penetrating through the semiconductor substrate 11 from the first surface to the second surface; the antenna 15 formed on the first surface and electrically connected to the through wirings 18; the element forming layer 21 formed on the second surface and electrically connected to the through wirings 18; the sealing layer 25 formed on the second surface of the semiconductor substrate 11 to cover the element forming layer 21 including the semiconductor element; and the external terminals 24 having one end portions exposed from the sealing layer 25 and the other end portions electrically connected to the semiconductor element in the element forming layer 21.

Further, according to the second embodiment of the present invention, the method of producing the semiconductor device 2 includes the steps of: preparing the semiconductor substrate 11 having the first surface and the second surface opposite to the first surface; forming the through holes 18A penetrating through the semiconductor substrate 11 from the first surface to the second surface; filling the through holes 18A with the conductive material to form the through wirings 18 penetrating through the semiconductor substrate 11; forming the element forming layer 21 including the semiconductor element and the wiring each electrically connected to the through wirings 18 on the second surface; forming the antenna 15 electrically connected to the through wirings 18 on the first surface; forming the external terminals 24 electrically connected to the semiconductor element in the element forming layer 21 on the second surface; and forming the sealing layer 25 on the second surface to cover the element forming layer 21 including the semiconductor element and the wiring such that the portions of the external terminals 24 are exposed.

According to the second embodiment of the present invention, the antenna 15 is formed on the surface (first surface) of the semiconductor substrate 11 opposite to the surface (second surface) with the semiconductor element formed thereon. Accordingly, it is possible to provide a large distance between the antenna 15 and the semiconductor element. As a result, it is possible to reduce influence received by the semiconductor element when the antenna 15 emits radio wave.

Further, the external terminals 24 are formed on the second surface of the semiconductor substrate 11 opposite to the first surface with the antenna 15 formed thereon. Accordingly, when the semiconductor device 1 is mounted on the mounting substrate 31, the antenna 15 is not sandwiched between the semiconductor substrate 11 and the mounting substrate 31. As a result, it is possible to prevent reception sensitivity of the semiconductor device 1 from lowering, or intensity of transmitted radio wave from decreasing.

According to the second embodiment of the present invention, the sealing layer 16A formed of the magnetic material is formed on the first surface of the semiconductor substrate 11 to cover the antenna 15. In the production method, the sealing layer 16A formed of the magnetic material is formed on the first surface of the semiconductor substrate 11 to cover the antenna 15. Accordingly, it is possible to further reduce influence received by the semiconductor element when the antenna 15 emits radio wave.

Third Embodiment

A third embodiment of the present invention will be explained with reference to the accompanying drawings. Components in the third embodiment similar to those in the first and second embodiments are designated with the same reference numerals, and explanations thereof are omitted. Components in the third embodiment without specific descriptions are same as those in the first and second embodiments.

Figure 5:
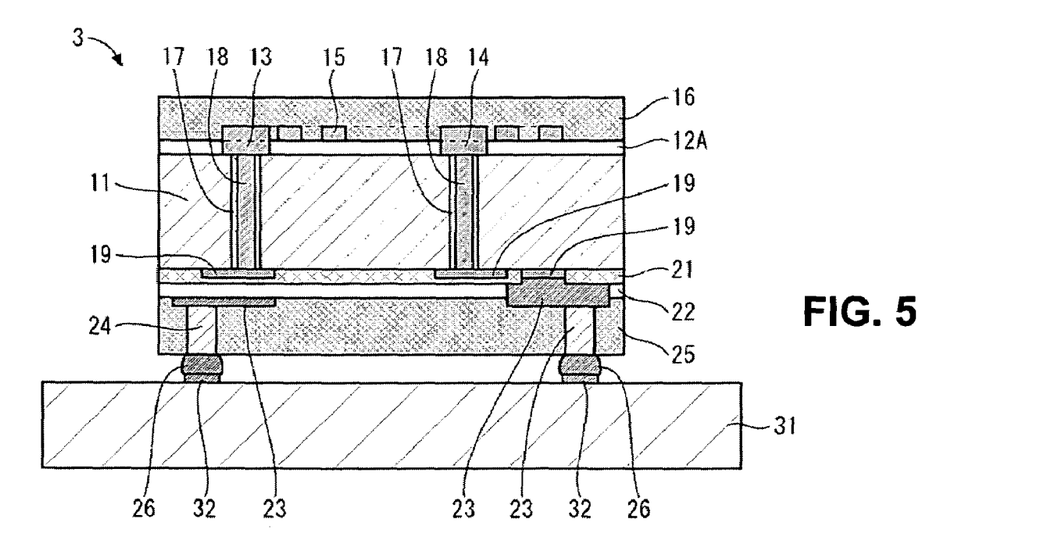
FIG. 5 is a schematic sectional view showing a semiconductor device according to a third embodiment of the present invention.

FIG. 5 is a schematic sectional view showing a semiconductor device 3 according to the third embodiment of the present invention. In FIG. 5, similar to FIG. 1(a), a section is taken along a plane perpendicular to the element forming surface of the semiconductor substrate 11.

As shown in FIG. 5, as opposed to the semiconductor device 1 in the first embodiment shown in FIG. 1(a), the semiconductor device 3 in the third embodiment includes an insulation layer 12A instead of the insulation layer 12 formed on the first surface of the semiconductor substrate 11 with the antenna 15 formed thereon in the first embodiment.

The insulation layer 12A is formed of a magnetic material, and has a thickness of, for example, about 5 to 10 µm similar to the first embodiment. The magnetic material includes an epoxy resin containing ferrite particles. The present invention is not limited thereto, and the magnetic material may include various thermosetting resins having thermosetting property and a resin state and containing various magnetic materials and magnetic members.

Other components and the production method are the same as those in the first embodiment, and explanations thereof are omitted. In the production method, the magnetic material in a resin state is spin-coated on the first surface of the semiconductor substrate 11 to form the insulation layer 12A.

As described above, according to the third embodiment of the present invention, the semiconductor device 3 includes the semiconductor substrate 11 having the first surface and the second surface opposite to the first surface; the through wirings 18 penetrating through the semiconductor substrate 11 from the first surface to the second surface; the antenna 15 formed on the first surface and electrically connected to the through wirings 18; the element forming layer 21 formed on the second surface and electrically connected to the through wirings 18; the sealing layer 25 formed on the second surface of the semiconductor substrate 11 to cover the element forming layer 21 including the semiconductor element; and the external terminals 24 having one end portions exposed from the sealing layer 25 and the other end portions electrically connected to the semiconductor element in the element forming layer 21.

Further, according to the third embodiment of the present invention, the method of producing the semiconductor device 3 includes the steps of: preparing the semiconductor substrate 11 having the first surface and the second surface opposite to the first surface; forming the through holes 18A penetrating through the semiconductor substrate 11 from the first surface to the second surface; filling the through holes 18A with the conductive material to form the through wirings 18 penetrating through the semiconductor substrate 11; forming the element forming layer 21 including the semiconductor element and the wiring each electrically connected to the through wirings 18 on the second surface; forming the antenna 15 electrically connected to the through wirings 18 on the first surface; forming the external terminals 24 electrically connected to the semiconductor element in the element forming layer 21 on the second surface; and forming the sealing layer 25 on the second surface to cover the element forming layer 21 including the semiconductor element and the wiring such that the portions of the external terminals 24 are exposed.

According to the third embodiment of the present invention, the antenna 15 is formed on the surface (first surface) of the semiconductor substrate 11 opposite to the surface (second surface) with the semiconductor element formed thereon. Accordingly, it is possible to provide a large distance between the antenna 15 and the semiconductor element. As a result, it is possible to reduce influence received by the semiconductor element when the antenna 15 emits radio wave.

Further, the external terminals 24 are formed on the second surface of the semiconductor substrate 11 opposite to the first surface with the antenna 15 formed thereon. Accordingly, when the semiconductor device 1 is mounted on the mounting substrate 31, the antenna 15 is not sandwiched between the semiconductor substrate 11 and the mounting substrate 31. As a result, it is possible to prevent reception sensitivity of the semiconductor device 1 from lowering, or intensity of transmitted radio wave from decreasing.

According to the third embodiment of the present invention, the semiconductor device 3 is provided with the insulation layer 12A formed of the magnetic material, and the antenna 15 is formed on the insulation layer 12A on the first surface. In the production method, the insulation layer 12A formed of the magnetic material is formed on the first surface, and the antenna 15 is formed on the insulation layer 12A on the first surface. Accordingly, it is possible to further reduce influence received by the semiconductor element when the antenna 15 emits radio wave.

Fourth Embodiment

A fourth embodiment of the present invention will be explained with reference to the accompanying drawings. Components in the third embodiment similar to those in the first to third embodiments are designated with the same reference numerals, and explanations thereof are omitted. Components in the third embodiment without specific descriptions are same as those in the first to third embodiments.

Figure 6:
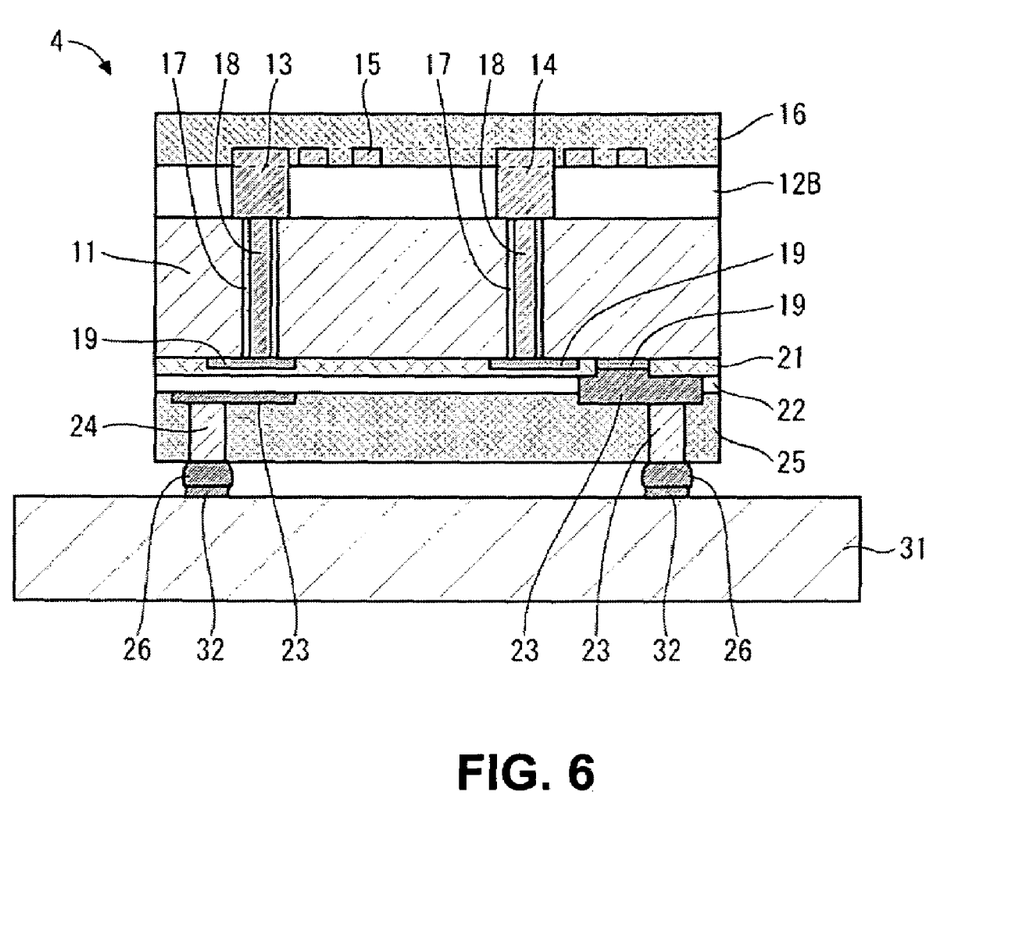
FIG. 6 is a schematic sectional view showing a semiconductor device according to a fourth embodiment of the present invention.

FIG. 6 is a schematic sectional view showing a semiconductor device 4 according to the fourth embodiment of the present invention. In FIG. 6, similar to FIG. 1(a), a section is taken along a plane perpendicular to the element forming surface of the semiconductor substrate 11.

As shown in FIG. 6, as opposed to the semiconductor device 1 in the first embodiment shown in FIG. 1(a), the semiconductor device 4 in the fourth embodiment includes an insulation layer 12B instead of the insulation layer 12 formed on the first surface of the semiconductor substrate 11 with the antenna 15 formed thereon in the first embodiment.

Similar to the first embodiment, the insulation layer 12B is provided for insulating the first surface of the semiconductor substrate 11 with the antenna 15 formed thereon. The insulation layer 12B may be formed of a polyimide, and have a thickness larger than that of the insulation layer 12 in the first embodiment, for example, about 50 μm.

Other components and the production method are the same as those in the first embodiment, and explanations thereof are omitted. In the production method, the insulation material such as a polyimide is spin-coated on the first surface of the semiconductor substrate 11 to have a thickness of about 50 μm. Then, the coated material is patterned with known lithography technology to form the insulation layer 12B with a thickness of 50 μm.

As described above, according to the fourth embodiment of the present invention, the semiconductor device 3 includes the semiconductor substrate 11 having the first surface and the second surface opposite to the first surface; the through wirings 18 penetrating through the semiconductor substrate 11 from the first surface to the second surface; the antenna 15 formed on the first surface and electrically connected to the through wirings 18; the element forming layer 21 formed on the second surface and electrically connected to the through wirings 18; the sealing layer 25 formed on the second surface of the semiconductor substrate 11 to cover the element forming layer 21 including the semiconductor element; and the external terminals 24 having one end portions exposed from the sealing layer 25 and the other end portions electrically connected to the semiconductor element in the element forming layer 21.

Further, according to the fourth embodiment of the present invention, the method of producing the semiconductor device 4 includes the steps of: preparing the semiconductor substrate 11 having the first surface and the second surface opposite to the first surface; forming the through holes 18A penetrating through the semiconductor substrate 11 from the first surface to the second surface; filling the through holes 18A with the conductive material to form the through wirings 18 penetrating through the semiconductor substrate 11; forming the element forming layer 21 including the semiconductor element and the wiring each electrically connected to the through wirings 18 on the second surface; forming the antenna 15 electrically connected to the through wirings 18 on the first surface; forming the external terminals 24 electrically connected to the semiconductor element in the element forming layer 21 on the second surface; and forming the sealing layer 25 on the second surface to cover the element forming layer 21 including the semiconductor element and the wiring such that the portions of the external terminals 24 are exposed.

According to the fourth embodiment of the present invention, the antenna 15 is formed on the surface (first surface) of the semiconductor substrate 11 opposite to the surface (second surface) with the semiconductor element formed thereon. Accordingly, it is possible to provide a large distance between the antenna 15 and the semiconductor element. As a result, it is possible to reduce influence received by the semiconductor element when the antenna 15 emits radio wave.

Further, the external terminals 24 are formed on the second surface of the semiconductor substrate 11 opposite to the first surface with the antenna 15 formed thereon. Accordingly, when the semiconductor device 1 is mounted on the mounting substrate 31, the antenna 15 is not sandwiched between the semiconductor substrate 11 and the mounting substrate 31. As a result, it is possible to prevent reception sensitivity of the semiconductor device 1 from lowering, or intensity of transmitted radio wave from decreasing.

According to the fourth embodiment of the present invention, the semiconductor device 4 is provided with the insulation layer 12B having a thickness larger than that of the insulation layer 12 in the first embodiment, and the antenna 15 is formed on the insulation layer 12B on the first surface. That is, the insulation layer 12B having a relatively large thickness is disposed between the antenna 15 and the semiconductor element.

Accordingly, it is possible to further reduce influence received by the semiconductor element when the antenna 15 emits radio wave.

Fifth Embodiment

A fifth embodiment of the present invention will be explained with reference to the accompanying drawings. Components in the fifth embodiment similar to those in the first to fourth embodiments are designated with the same reference numerals, and explanations thereof are omitted. Components in the fifth embodiment without specific descriptions are same as those in the first to fourth embodiments.

Figure 7:
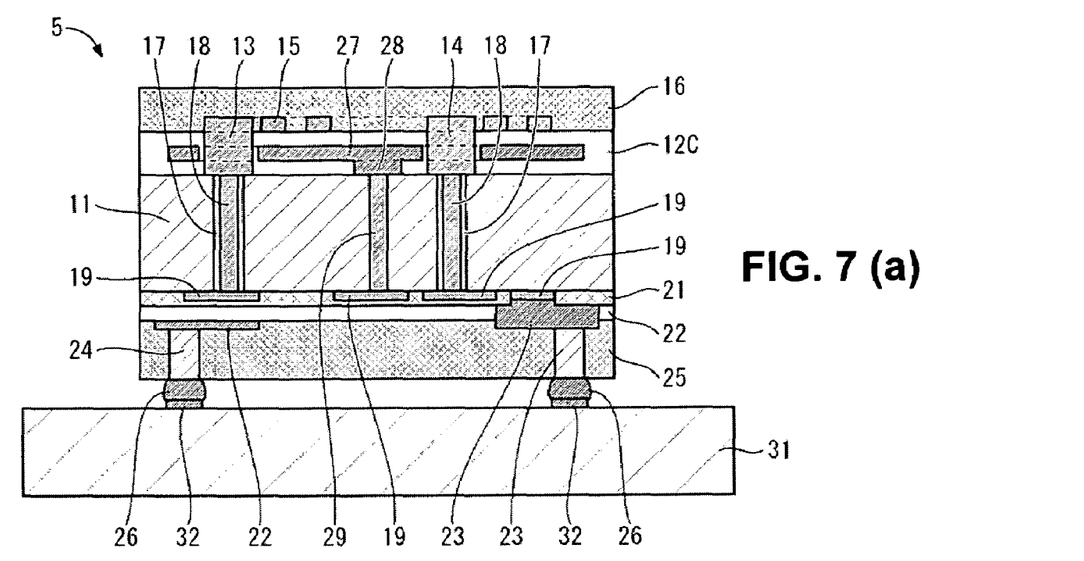
FIG. 7(a) is a schematic sectional view showing a semiconductor device according to a fifth embodiment of the present invention.
FIG. 7(b) is a schematic plan view showing a shield according to the fifth embodiment of the present invention.

FIG. 7(a) is a schematic sectional view showing a semiconductor device 5 according to a fifth embodiment of the present invention. FIG. 7(b) is a schematic plan view showing a shield according to the fifth embodiment of the present invention. In FIG. 7(a), similar to FIG. 1(a), a section is taken along a plane perpendicular to the element forming surface of the semiconductor substrate 11.

As shown in FIG. 7(a), as opposed to the semiconductor device 1 in the first embodiment shown in FIG. 1(a), the semiconductor device 5 in the fifth embodiment includes an insulation layer 12C instead of the insulation layer 12 formed on the first surface of the semiconductor substrate 11 with the antenna 15 formed thereon in the first embodiment. Further, the semiconductor device 5 in the fifth embodiment includes a shield 27 and an electrode pad 28 formed in the insulation layer 12C, and a through wiring 29 for drawing electrical connection of the shield 27 to the side of the second surface of the semiconductor substrate 11.

Similar to the insulation layer 12B in the fourth embodiment, the insulation layer 12C is provided for insulating the first surface of the semiconductor substrate 11 with the antenna 15 formed thereon. The insulation layer 12C may be formed of a polyimide, and have a thickness of, for example, about 50 μm.

The shield 27 is formed in the insulation layer 12C for reducing influence received by the semiconductor element when the antenna 15 emits radio wave. The shield 27 may be formed of a conductive material such as copper and aluminum, and have a thickness of, for example, about 0.5 μm.

As shown in FIG. 7(b), the shield 27 is branched into a plurality of portions 27a crossing the antenna 15 in an extension direction thereof. In the embodiment, the antenna 15 has a coil shape, and the shield 27 is divided into the portions 27a with slits extending from a center of the coil shape in radial directions. With the configuration described above, it is possible to prevent excess current from flowing through the shield 27 when a current flows through the antenna 15.

In the fifth embodiment, the shield 27 is electrically grounded through a specific wiring. In particular, the portions 27a of the shield 27 are electrically connected to the electrode pad 28 situated at a center portion of the shield 27. The electrode pad 28 is electrically connected to an earth line disposed in the element forming layer 21 through the through wiring 29, so that the shield 27 is grounded. The center portion of the shield 27 corresponds to the center of the coil shape of the antenna 15. The electrode pad 28 is constituted similar to the electrode pads 19 and the electrode pads 23 in the first to fourth embodiments. The through wiring 29 is constituted similar to the through wirings 18 in the first to fourth embodiments. Other components in the fifth embodiment are similar to those in the first embodiment, and explanations thereof are omitted.

Figure 8:
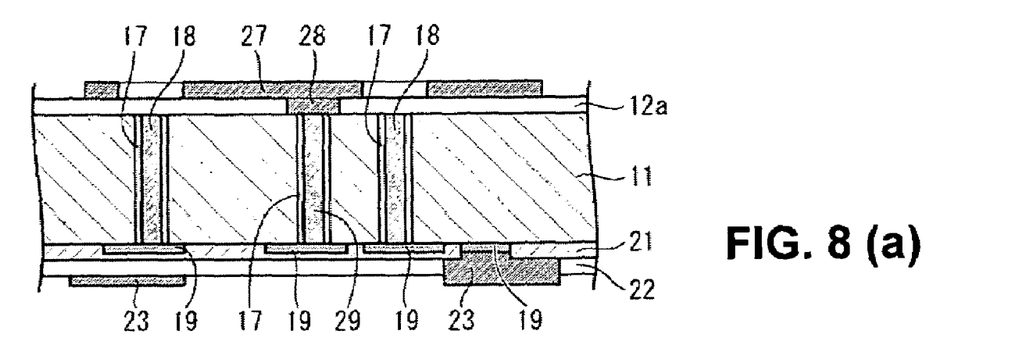
FIGS. 8(a) to 8(c) are schematic views showing a method of producing the semiconductor device according to the fifth embodiments of the present invention.

A method of producing the semiconductor device 5 in the fifth embodiment will be explained next with reference to the accompanying drawings. FIGS. 8(a) to 8(c) are schematic views showing the method of producing the semiconductor device 5 according to the fifth embodiments of the present invention.

In the fifth embodiment, steps up to forming the electrode pads 23 on the second surface of the semiconductor substrate 11 are the same as those in the first embodiment (from FIG. 2(a) to FIG. 3(b)), and explanations thereof are omitted. Further, steps from sealing the first and second surfaces of the semiconductor substrate 11 with the sealing layer 16 and the sealing layer 25, respectively, up to dicing the semiconductor substrate 11 to individually produce the semiconductor device are the same as those in the first embodiment (FIG. 3(d)), and explanations thereof are omitted.

In the fifth embodiment, the through wiring 29 is formed together with the through wirings 18 through a similar method. Further, the electrode pads 19 formed on the second surface of the semiconductor substrate 11 includes the electrode pad 19 electrically connected to the through wiring 29. Further, the element forming layer 21 formed on the second surface of the semiconductor substrate 11 includes the wiring for grounding the electrode pad 19 electrically connected to the through wiring 29.

After the element forming layer 21, the electrode pads 19, the insulation layer 22, and the electrode pads 23 are formed on the first surface of the semiconductor substrate 11 through the steps similar to those in the first embodiment, the semiconductor substrate 11 is turned upside down so that the first surface faces upward. Then, an insulation material such as polyimide is spin-coated on the first surface of the semiconductor substrate 11 up to a thickness of about 25 μm, thereby forming an insulation layer 12a.

In the next step, the insulation layer 12a is patterned with known photolithography technique to form the opening portions for exposing the through wirings 18 exposed in the first surface of the semiconductor substrate 11. Then, metal such as copper or aluminum is deposited on the insulation layer 12a and inside the opening portions formed in the insulation layer 12a with CVD method or sputtering-method, so that the conductive layer with a thickness of about 0.5 μm from the surface of the insulation layer 12a is formed on the insulation layer 12a and inside the opening portions formed in the insulation layer 12a. Then, the conductive layer is patterned with known photolithography technique to form the electrode pad 28 inside the opening portions formed in the insulation layer 12 and the shield 27 on the insulation layer 12a as shown in FIG. 8(a).

In the next step, an insulation material such as polyimide is spin-coated on the insulation layer 12a and the shield 27 up to a thickness of about 24.5 μm from an upper surface of the shield 27, thereby forming an insulation layer 12b. Accordingly, as shown in FIG. 8(b), the insulation layer 12C including the shield 27 therein is formed on the first surface of the semiconductor substrate 11.

In the next step, the insulation layer 12C is patterned with known photolithography technique to form the opening portions for exposing the through wirings 18 exposed in the first surface of the semiconductor substrate 11. Then, metal such as copper or aluminum is deposited on the insulation layer 12C and inside the opening portions formed in the insulation layer 12C with CVD method or sputtering method, so that the conductive layer with a thickness of about 0.5 μm from the surface of the insulation layer 12C is formed on the insulation layer 12C and inside the opening portions formed in the insulation layer 12C. Then, the conductive layer is patterned with known photolithography technique to form the electrode pad 13 and the electrode pad 14 inside the opening portions formed in the insulation layer 12C and the antenna 15 on the insulation layer 12C as shown in FIG. 8(c).

In the next step, similar to the first embodiment, a thermosetting resin such as an epoxy resin is coated on the first surface and second surface of the semiconductor substrate 11. Then, the thermosetting resin is cured with heat to form the sealing layer 16 and the sealing layer 25 on the first surface and second surface, respectively. As shown in FIG. 3(d), the semiconductor substrate 11 is cut into pieces with a known dicing device. Accordingly, it is possible to produce the semiconductor device 5 having the terminals (surfaces of the external terminals 24) to be bonded to the mounting substrate 31 on the element forming surface (second surface); the antenna 15 on the opposite surface (first surface) opposite to the element forming surface (second surface); and the shield 27 between the antenna 15 and the element forming layer 21.

As described above, according to the fifth embodiment of the present invention, the semiconductor device 5 includes the semiconductor substrate 11 having the first surface and the second surface opposite to the first surface; the through wirings 18 penetrating through the semiconductor substrate 11 from the first surface to the second surface; the antenna 15 formed on the first surface and electrically connected to the through wirings 18; the element forming layer 21 formed on the second surface and electrically connected to the through wirings 18; the sealing layer 25 formed on the second surface of the semiconductor substrate 11 to cover the element forming layer 21 including the semiconductor element; and the external terminals 24 having one end portions exposed from the sealing layer 25 and the other end portions electrically connected to the semiconductor element in the element forming layer 21. Further, the semiconductor device 5 includes the shield 27 formed between the antenna 15 and the semiconductor substrate 11 and grounded through the specific wiring such as the earth line disposed in the element forming layer 21 through the through wiring 29

Further, according to the fifth embodiment of the present invention, the method of producing the semiconductor device 5 includes the steps of: preparing the semiconductor substrate 11 having the first surface and the second surface opposite to the first surface; forming the through holes 18A penetrating through the semiconductor substrate 11 from the first surface to the second surface; filling the through holes 18A with the conductive material to form the through wirings 18 and 29 penetrating through the semiconductor substrate 11; forming the element forming layer 21 including the semiconductor element-and the wiring each electrically connected to the through wirings 18 on the second surface; forming the insulation layer 12a on the first surface; forming the openings in the insulation layer 12a to expose the through wirings 18, forming the conductive layer on the insulation layer 12a and inside the openings to form the electrode pad 28 and the shield 27; forming the insulation layer 12b on the insulation layer 12a, the electrode pad 28, and the shield 27 to form the insulation layer 12C including the shield 27 therein; forming the opening in the insulation layer 12C to expose the through wiring 29; forming the antenna 15 electrically connected to the through wiring 29 on the insulation layer 12C and inside the opening; forming the external terminals 24 electrically connected to the semiconductor element in the element forming layer 21 on the second surface; and forming the sealing layer 25 on the second surface to cover the element forming layer 21 including the semiconductor element and the wiring such that the portions of the external terminals 24 are exposed.

According to the fifth embodiment of the present invention, the antenna 15 is formed on the surface (first surface) of the semiconductor substrate 11 opposite to the surface (second surface) with the semiconductor element formed thereon. Accordingly, it is possible to provide a large distance between the antenna 15 and the semiconductor element. As a result, it is possible to reduce influence received by the semiconductor element when the antenna 15 emits radio wave.

Further, the external terminals 24 are formed on the second surface of the semiconductor substrate 11 opposite to the first surface with the antenna 15 formed thereon. Accordingly, when the semiconductor device 1 is mounted on the mounting substrate 31, the antenna 15 is not sandwiched between the semiconductor substrate 11 and the mounting substrate 31. As a result, it is possible to prevent reception sensitivity of the semiconductor device 1 from lowering, or intensity of transmitted radio wave from decreasing.

According to the fifth embodiment of the present invention, the semiconductor device 5 is provided with the shield 27 between the antenna 15 and the semiconductor substrate 11. Accordingly, it is possible to further reduce influence received by the semiconductor element when the antenna 15 emits radio wave.

The disclosure of Japanese Patent Application No. 2006-130733, filed on May 9, 2006, is incorporated in the application.

While the invention has been explained with reference to the specific embodiments of the invention, the explanation is illustrative and the invention is limited only by the appended claims.

What is claimed is:

1. A semiconductor device comprising:
  a semiconductor substrate having a first surface and a second surface opposite to the first surface;
  a first through wiring penetrating through the semiconductor substrate from the first surface to the second surface;
  an antenna formed on the first surface and electrically connected to the first through wiring;
  a semiconductor element formed on the second surface and electrically connected to the first through wiring;
  a first sealing layer formed on the second surface to directly contact with the semiconductor element;
  a first external terminal having one end portion exposed from the first sealing layer and the other end portion electrically connected to the semiconductor element; and
  an insulation layer formed on the first surface such that the antenna is formed on the insulation layer, said insulation layer being formed of a magnetic material.

2. The semiconductor device according to claim 1, further comprising a second sealing layer formed on the first surface for covering the antenna, said second sealing layer being formed of a magnetic material.

3. A semiconductor device, comprising:
  a semiconductor substrate having a first surface and a second surface opposite to the first surface;
  a first through wiring penetrating through the semiconductor substrate from the first surface to the second surface;
  an antenna formed on the first surface and electrically connected to the first through wiring;
  a semiconductor element formed on the second surface and electrically connected to the first through wiring;
  a first sealing layer formed on the second surface to cover the semiconductor element;
  a first external terminal having one end portion exposed from the first sealing layer and the other end portion electrically connected to the semiconductor element; and
  an insulation layer formed on the first surface such that the antenna is formed on the insulation layer, said insulation layer being formed of a magnetic material.

4. The semiconductor device according to claim 1, further comprising a conductive layer between the antenna and the semiconductor substrate, said conductive layer being grounded through a specific wiring.

5. The semiconductor device according to claim 4, further comprising a second through wiring penetrating through the semiconductor substrate from the first surface to the second surface, said conductive layer being grounded through the second through wiring.

6. The semiconductor device according to claim 1, further comprising a mounting substrate having a second external terminal, and a bump for mechanically fixing and electrically connecting the first external terminal and the second external terminal, said semiconductor substrate being mounted on the mounting substrate through the bump such that the second surface faces the mounting substrate.

7. The semiconductor device according to claim 3, further comprising a second sealing layer formed on the first surface for covering the antenna, said second sealing layer being formed of a magnetic material.

8. The semiconductor device according to claim 3, further comprising a conductive layer between the antenna and the semiconductor substrate, said conductive layer being grounded through a specific wiring.

9. The semiconductor device according to claim 8, further comprising a second through wiring penetrating through the semiconductor substrate from the first surface to the second surface, said conductive layer being grounded through the second through wiring.

10. The semiconductor device according to claim 3, further comprising a mounting substrate having a second external terminal, and a bump for mechanically fixing and electrically connecting the first external terminal and the second external terminal, said semiconductor substrate being mounted on the mounting substrate through the bump such that the second surface faces the mounting substrate.

* * * * *